(12) United States Patent
Kamath et al.

(10) Patent No.: US 6,687,114 B1
(45) Date of Patent: Feb. 3, 2004

(54) HIGH DENSITY MEMORY WITH STORAGE CAPACITOR

(75) Inventors: Arvind Kamath, Mountain View, CA (US); Ruggero Castagnetti, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 37 days.

(21) Appl. No.: 10/403,433

(22) Filed: Mar. 31, 2003

Related U.S. Application Data

(62) Division of application No. 10/214,618, filed on Aug. 8, 2002.

(51) Int. Cl.[7] .................. H01G 4/228; H01L 21/8238
(52) U.S. Cl. .................. 361/306.3; 361/303; 361/313; 438/212; 438/271; 438/268
(58) Field of Search .................. 361/306.3, 311, 361/312, 313, 321.2; 438/212, 271, 268, 259, 282, 283, 170; 257/330, 333, 334, 300, 329

(56) References Cited

U.S. PATENT DOCUMENTS

| | | | | |
|---|---|---|---|---|
| 4,200,968 A | * | 5/1980 | Schroeder | 438/271 |
| 4,364,074 A | * | 12/1982 | Garnache et al. | 257/302 |
| 4,502,208 A | * | 3/1985 | McPherson | 438/281 |
| 4,763,180 A | * | 8/1988 | Hwang et al. | 257/302 |

* cited by examiner

*Primary Examiner*—Anthony Dinkins
(74) *Attorney, Agent, or Firm*—Luedeka, Neely & Graham PC

(57) ABSTRACT

A memory cell having a transistor and a capacitor formed in a silicon substrate. The capacitor is formed with a lower electrically conductive plate etched in a projected surface area of the silicon substrate. The lower electrically conductive plate has at least one cross section in the shape of a vee, where the sides of the vee are disposed at an angle of about fifty-five degrees from a top surface of the silicon substrate. The surface area of the lower electrically conductive plate is about seventy-three percent larger than the projected surface area of the silicon substrate in which the lower electrically conductive plate is etched. A capacitor dielectric layer is formed of a first deposited dielectric layer, which is disposed adjacent the lower electrically conductive plate. A top electrically conductive plate is disposed adjacent the capacitor dielectric layer and opposite the lower electrically conductive plate. A transistor is formed having source and drain regions separated by a channel region, and a gate dielectric layer formed of the first deposited dielectric layer.

8 Claims, 1 Drawing Sheet

HIGH DENSITY MEMORY WITH STORAGE CAPACITOR

Amend the specification by inserting before the first line the sentence: This is a divisional of copending application Ser. No. 10/214,618 filed Aug. 8, 2002.

FIELD

This invention relates to the field of integrated circuit fabrication. More particularly, this invention relates to high density structures used in system on chip architectures.

BACKGROUND

System on chip architectures are used for forming monolithic integrated circuits that incorporate both memory and logic functions on the same semiconducting substrate. System on chip architecture poses several problems to traditional integrated circuit process design, because the processes traditionally used to fabricate memory devices are not well adapted to the formation of logic devices. This is because the memory devices tend to have different design goals than the logic devices. For example, reducing leakage is a primary design goal of a memory device, whereas high switching speed is a design goal of a logic device.

The structures formed in the different semiconducting devices, such as gate oxide thickness, tend to favor either one goal or the other, but typically do not favor both. This same condition exists for many other structures that are seemingly common between memory and logic devices, in that each type of device may utilize a common structure or material, but the desired form of the structure is somewhat different for each type of device. Thus, as mentioned above, a traditional logic process sequence or flow, such as a CMOS process flow, is not well adapted to forming the memory devices in a system on chip architecture.

There also exist additional constraints that are more common to a wide variety of architectures, such as space limitations, otherwise referred to as device density. There is a continual desire to produce faster and otherwise more powerful integrated circuits, while at the same time reducing other factors such as power consumption, heat dissipation, and circuit size. One way in which these goals can be met, at least in part, is to reduce the surface area on the substrate that is required for a given circuit structure. Unfortunately, reducing the surface area of a structure also tends to impact other parameters of the structure, such as electrical characteristics.

Thus, there is a need for structures and process flows by which memory devices can be fabricated concurrently with logic devices while not excessively increasing the number of required process steps, and by which structures can be reduced in size without adversely impacting their electrical parameters.

SUMMARY

The above and other needs are met by a memory cell having a transistor and a capacitor formed in a silicon substrate. The capacitor is formed with a lower electrically conductive plate etched in a projected surface area of the silicon substrate. The lower electrically conductive plate has at least one cross section in the shape of a vee, where the sides of the vee are disposed at an angle of about fifty-five degrees from a top surface of the silicon substrate. The surface area of the lower electrically conductive plate is about seventy-three percent larger than the projected surface area of the silicon substrate in which the lower electrically conductive plate is etched. A capacitor dielectric layer is formed of a first deposited dielectric layer, which is disposed adjacent the lower electrically conductive plate. A top electrically conductive plate is disposed adjacent the capacitor dielectric layer and opposite the lower electrically conductive plate. A transistor is formed having source and drain regions separated by a channel region, and a gate dielectric layer formed of the first deposited dielectric layer.

In this manner, a capacitor such as for a high density memory cell that uses a planar MOS capacitor as a storage element (called a C-RAM herein) can be formed in a CMOS process flow, where the capacitor has a larger surface area, and hence a larger capacitance, than would a capacitor formed in just the projected surface area. In other words, by etching down into the silicon substrate within the projected surface area, a greater effective surface area for the capacitor is realized, without using a larger projected surface area. Thus, a high capacitance is realized within a given projected surface area, and the device density of the integrated circuit is thereby increased.

Further, the dielectric layer grows faster on the etched surface of the substrate in the capacitor region than it does on the top surface of the substrate in the gate area, thereby forming a thicker dielectric layer in the capacitor than on other portions of the substrate, such as in gate areas. Thus, the gate dielectric can be concurrently formed with the capacitor dielectric, while each retains different electrical properties that are preferred for the different structures so formed.

In various preferred embodiments of the invention, the lower electrically conductive plate is formed with one of N doping or P doping. The dielectric layer is preferably formed of silicon oxide. Most preferably, the top electrically conductive plate comprises doped polysilicon, but in alternate embodiments is formed of metal. The lower electrically conductive plate is preferably etched along the (111) planes of the silicon substrate, and the top surface of the silicon substrate is along the (100) plane.

According to another aspect of the invention there is described a method of forming a capacitor. A mask is formed on the (100) surface of a silicon substrate to expose a capacitor area, and the capacitor area of the surface of the silicon substrate is cleaned. The capacitor area is cleaned with an etchant that preferentially etches the silicon substrate with a high degree of selectivity along the (111) planes of the silicon substrate. Such etching forms lower capacitor surfaces that are disposed at about fifty-five degrees from the surface of the silicon substrate. The etch is self limiting and substantially stops when the capacitor surfaces are bounded by edges of the capacitor area and one another. The silicon substrate in a portion disposed under the lower capacitor surfaces is altered so as to be electrically conductive. The mask is removed from the surface of the silicon substrate. A dielectric layer is formed on the lower capacitor surfaces, and a top capacitor plate is formed of an electrically conductive material on the dielectric layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

As the thin gate oxides for very high performance devices have scaled below twenty angstroms in thickness, the exponentially high gate leakages due to quantum mechanical tunneling tend to prohibit optimum operation and performance of C-RAM arrays. Thus, gate oxides for these structures are preferably thicker than those used for the high performance transistor areas of the integrated circuit, in order to reduce gate leakage. This typically requires additional process steps, including oxidations, to achieve multiple dielectric thicknesses on the same monolithic circuit. The present invention overcomes such process complexity.

Figure 1:
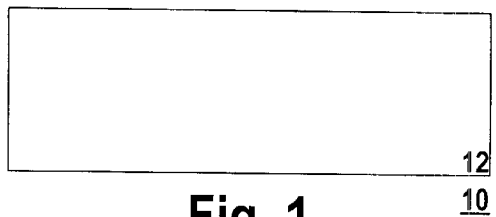
FIG. 1 is a cross sectional view of a substrate.
Figure 2:
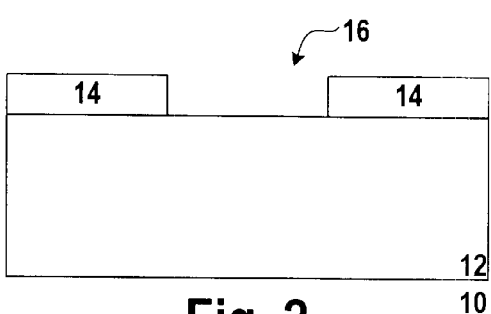
FIG. 2 is a cross sectional view of a substrate with a masking layer.

With reference now to FIG. 1 there is depicted a portion of an integrated circuit 10, including a substrate 12, which in the preferred embodiment is a silicon substrate 12. Most preferably, the silicon substrate 12 is aligned with the (100) crystal plane as the top surface of the substrate 12. The designation of crystal planes as used herein is in accordance with the Miller indices. As depicted in FIG. 2, the substrate 12 is masked with a mask 14 to expose a projected surface area 16, also called a capacitor area 16 herein. The mask 14 may take one of a variety of forms such as those which are common in the art, but is preferably a photoresist mask 14.

The integrated circuit 10 is preferably cleaned, such as with a solution of hydrofluoric acid. The primary purpose of this cleaning step is to not only remove any general contaminants from the surface of the substrate 12, but more specifically to ensure that there are substantially no oxides of any kind remaining on the surface of the substrate 12 within the capacitor area 16. Thus, the clean is most preferably accomplished in a non oxidizing environment, so that no oxides of any kind, whether chemical, native, or thermal, are reformed in the capacitor area 16.

Figure 3:
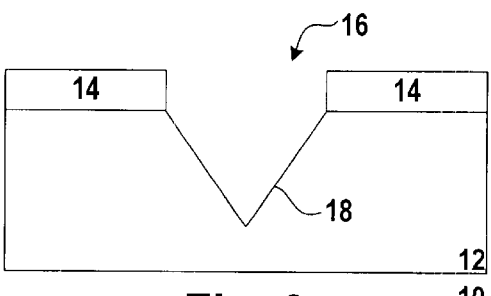
FIG. 3 is a cross sectional view of a substrate that has been etched through a masking layer.

Following the clean as described above, the substrate 12 is subjected to an etchant of a type that has a very specific effect on the substrate 12, in that the etchant has a highly selective etch rate along a specific crystal plane of the substrate 12, forming the structure as depicted in FIG. 3, having sloping surfaces 18. The etch is preferable accomplished in a non oxidizing environment, for reasons as described above. Most preferably, the substrate 12 is not subjected to an oxidizing environment between the steps of the clean and the etch, for similar reasons. The mask 14 is removed after the etching is complete.

Figure 4:
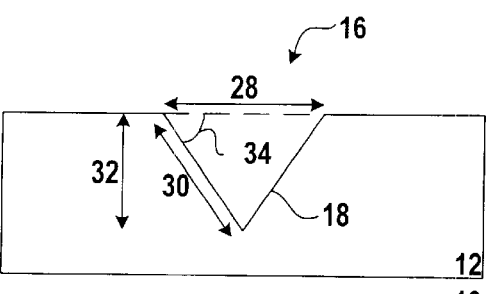
FIG. 4 is a cross sectional view of an etched substrate with the masking layer removed.

In the preferred embodiment, the etchant is a dilute base, most preferably ammonium hydroxide, which when applied to a silicon substrate 12 has an etch selectivity of about one hundred to one along the (111) planes of the silicon substrate 12. In this manner, lower capacitor surfaces 18 are formed with the silicon substrate 12 in the capacitor area 16, which are disposed at an angle 34 of about fifty-five degrees from the top surface of the substrate 12, as depicted in FIG. 4. FIG. 4 also depicts other dimensions as described in more detail below.

In another embodiment, a hard mask layer such as silicon nitride is deposited on the substrate 12 prior to the photo masking and etching steps. The hard mask is then patterned with the photo mask 14 to reveal the portion of the substrate 12 in which the etching for the capacitor area 16 is to occur. Once etching is complete, as described above, and the photo mask 14 is removed, then the hard mask is also preferably removed before subsequent processing is accomplished. In this manner, the hard mask tends to additionally protect the substrate 12 near the edges of the capacitor area 16, which tends to enable the formation of sharp, distinct corners at the edge of the capacitor area 16.

Width 28 defines the linear width of the capacitor area 16 as measured along the top surface of the substrate 12. Similarly, depth 32 defines the linear depth of the capacitor area 16 as measured along a line normal to the top surface of the substrate 12. Length 30 defines the length of one of the surfaces 18 of the capacitor area 16. It is seen that by forming the lower capacitor surface 18 by the etching process described above, that a greater surface area is formed within the capacitor area 16 than would have existed on the top surface of the substrate 12 without such an etch.

The etch as described above produces a surface area on the lower capacitor surfaces 18 that is about seventy-three percent larger than would be found on the top surface of the substrate 12 in the absence of such an etch. Thus, a capacitor formed on the lower capacitor surfaces 18 within the capacitor area 16 will preferably have a capacitance that is about seventy-three percent greater than a capacitor that is formed on the un-etched surface of the substrate 12 within the capacitor area 16, if other parameters are held equal. In this manner, a capacitor having a higher capacitance can be formed within a smaller capacitor area 16, which effectually increases the device density of the integrated circuit 10.

The depth 32 of the etched portion is about seventy-one percent of the smallest width 28 of the capacitor area 16. Similarly, the length 30 of the etched portion is also about seventy-one percent of the smallest width 28 of the capacitor area 16. Although these dimensions can be calculated to a high degree of precision using the angles determined between the two crystal planes described above, it is appreciated that there may be slight variations in the exact surface orientation of a substrate 12, and crystallographic point and slip dislocations which may effect the exact dimensions to a relatively small degree. However, the dimensions as given above are sufficient to specify the metes and bounds of the desired etch.

One tremendous benefit of the etch as described above is that it is self limiting, in that when the surfaces 18 meet at the bottom of the etched trench within the capacitor area 16, the etching process stops. Further, the etching does not proceed at an appreciable rate in other directions, such as under the mask 14, because of the high selectivity of the etch for the (111) crystallographic planes of the silicon substrate 12. Thus, no special considerations, other than those mentioned above, need be taken in order to ensure that the trench within the capacitor area 16 is properly formed and the lower capacitor surfaces 18 are thereby properly formed.

Figure 5:
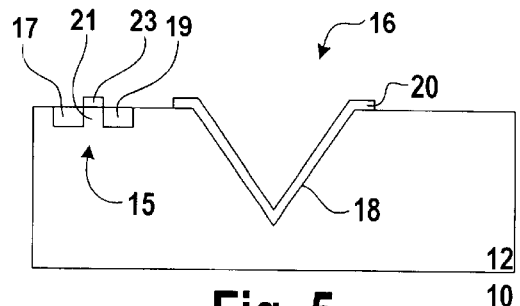
FIG. 5 is a cross sectional view of an etched substrate with an overlying dielectric layer.

After the etch is completed, a dielectric layer 20 is formed on the lower capacitor surfaces 18, as depicted in FIG. 5. The dielectric layer 20 is most preferably silicon oxide, and is formed at thickness that supports the desired capacitance of the capacitor to be formed, as directed by the requirements of the specific circuits to be formed. The dielectric layer 20 is also used in other portions of the integrated circuit 10 as the gate dielectric layer 23 for CMOS devices 15 that are simultaneously formed as the capacitor is formed. This is one of the unique aspects of the present invention, in that it provides for the simultaneous formation of a capacitor dielectric, which has one set of electrical design parameters, a gate dielectric, which has another set of electrical design parameters.

The capacitor dielectric 20 and the gate dielectric 23 may be formed at the same time under the present invention, because of the differential growth rate of the dielectric layer 20, preferable silicon oxide on a silicon substrate 12, between the planes within the v groove of the capacitor area 16 and the top surface plane of the substrate 12. As mentioned above, the growth rate of the silicon oxide layer 20 is greater within the etched capacitor area 16 than it is on the top surface of the substrate 12. In this manner, a dielectric layer 20 having proper electrical characteristics can be formed at the same time that a gate dielectric layer 23 having proper, and different, electrical characteristics is formed.

The gate dielectric layer 23 is preferably formed over a channel region 21, between a source region 17 and drain region 19, as is known in the art. These structures preferably form a CMOS transistor 15. Thus, the present invention provides for the concurrent formation of a capacitor dielectric layer 20 with a gate dielectric layer 23, even though the two dielectric layers 20 and 23 preferably have different electrical properties. This is made possible by the differential growth rate at the top surface of the silicon substrate 12 and the surface 18 of the silicon substrate 12, as explained elsewhere herein.

In various embodiments, the dielectric layer 20, which as described above is used both for the capacitor to be formed in the capacitor area and as a gate dielectric 23, is one or more of silicon oxide or a high k material. The high k material is in one embodiment deposited to the same equivalent thickness as that desired from a silicon oxide gate dielectric, which provides lower leakage for the transistor so formed. Alternately, the high k material is deposed to a lower equivalent thickness, which then has the same leakage in the transistor as a silicon oxide layer, but which enables higher drive currents and capacitance. Further yet, the high k material can be deposited to an intermediate thickness to produce a combination of benefits between leakage and speed of the transistor device.

Figure 6:
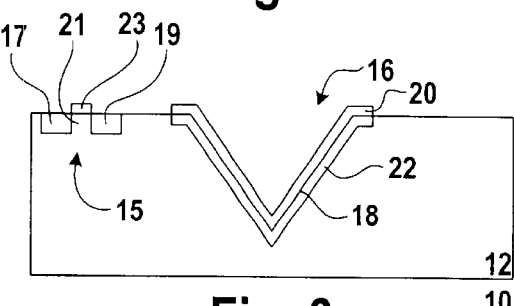
FIG. 6 is a cross sectional view of an etched substrate that has been altered to be electrically conductive.

As depicted in FIG. 6, the silicon substrate 12 is altered in a portion 22 so as to be electrically conductive, forming lower electrically conductive plates 22 along the lower capacitor surfaces 18. Most preferably the altering of the substrate 12 is accomplished with ion implantation of a dopant species, such as an N or P type dopant, at a level that is sufficient to cause that portion 22 of the semiconducting substrate 12 to become electrically conductive.

It is appreciated that several of the steps as described above may be performed in a variety of different orders. For example, the mask 14 may remain in place while the implantation of the plates 22 is accomplished, after which the mask 14 is removed and the dielectric 20 is formed. Other orders of the steps as described above and below are also contemplated.

Figure 7:
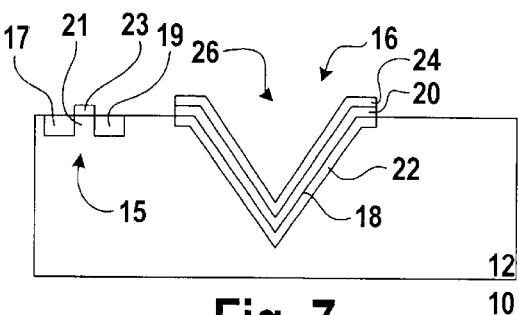
FIG. 7 is a cross sectional view of a substrate with a formed capacitor and transistor.

A top capacitor plate 24 is formed on the dielectric layer 20, as depicted in FIG. 7. The top capacitor plate 24 is preferably electrically conductive, and is most preferably formed of a doped polysilicon, but may alternately be formed of another electrically conductive material, such as a metal. Thus, a completed capacitor 26 is now formed. When an electrical potential is applied between the top plates 24 and the bottom plates 22, the dielectric layer 20 tends to store a charge, according to known principles.

Figure 8:
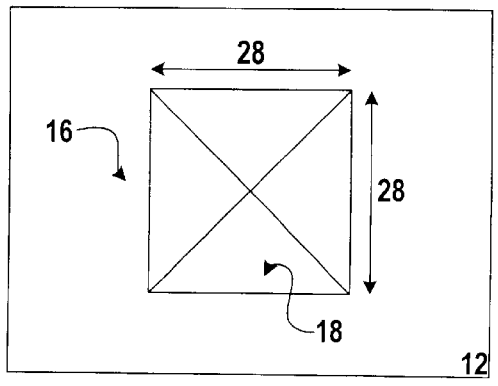
FIG. 8 is a top plan view of an etched substrate.

FIG. 8 depicts the etched trench within the capacitor area 16, showing the etch profile where the various lower plates 18 meet one another and the edges of the masked capacitor area 16.

The etching process as described above can be inserted at one of a number of different positions within a standard CMOS process flow, as understood in the art. For example, the etch process can be performed after sacrificial oxidation or after first gate oxidation. Placing the etch process after sacrificial oxidation has the benefit that the well and voltage threshold implants will be performed conformally with the etched lower capacitor surfaces 18. This may tend to provide better device and isolation characteristics. In addition, the structure will be subjected to a gate oxidation cycle that may help to round out the bottom sharp corner in the trench, where the electric field will tend to be at a maximum.

By forming the dielectric layer 20 concurrently with a gate oxidation step for other devices, the dielectric layer 20 will tend to grow at a faster rate on the (111) lower capacitor surfaces 18 than on other surfaces of the silicon substrate 12, such as the top (100) plane. Thus, with the same oxidation step. a thinner gate oxide is formed on the access transistor of the C-RAM and the high performance logic devices within the integrated circuit 10, and a lower leakage capacitor 26 (thicker dielectric layer 20) with about a seventy-three percent higher capacitance is formed with no additional oxidation of the capacitor 26 required. Thus, the present method eliminates at least one oxidation step and one cleaning step over the prior art, which reduces manufacturing cost and cycle time.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A memory cell having a transistor and a capacitor formed in a silicon substrate, the memory cell comprising:
   a capacitor having;
      a lower electrically conductive plate etched in a projected surface area of the silicon substrate, the lower electrically conductive plate having at least one cross section in the shape of a vee, where sides of the vee are disposed at an angle of about fifty-five degrees from a top surface of the silicon substrate, and a surface area of the lower electrically conductive plate is about seventy-three percent larger than the projected surface area of the silicon substrate in which the lower electrically conductive plate is etched,
      a capacitor dielectric layer formed of a first deposited dielectric layer, disposed adjacent the lower electrically conductive plate, and a top electrically conductive plate disposed adjacent the capacitor dielectric layer and opposite the lower electrically conductive plate, and a transistor having source and drain regions separated by a channel region, and a gate dielectric layer formed of the first deposited dielectric layer.

2. The capacitor of claim 1, wherein the lower electrically conductive plate comprises N doping.

3. The capacitor of claim 1, wherein the first deposited dielectric layer comprises silicon oxide.

4. The capacitor of claim 1, wherein the first deposited dielectric layer comprises a high k material.

5. The capacitor of claim 1, wherein the top electrically conductive plate comprises doped polysilicon.

6. The capacitor of claim 1, wherein the top electrically conductive plate comprises metal.

7. The capacitor of claim 1, wherein the lower electrically conductive plate is etched along (111) planes of the silicon substrate.

8. The capacitor of claim 1, wherein the top surface of the silicon substrate is along a (100) plane.

* * * * *